(12) United States Patent  
Kumura et al.

(10) Patent No.: US 7,348,617 B2
(45) Date of Patent: Mar. 25, 2008

(54) SEMICONDUCTOR DEVICE

(75) Inventors: Yoshinori Kumura, Yokohama (JP); Tohru Ozaki, Tokyo (JP); Susumu Shuto, Yokohama (JP); Yoshiro Shimojo, Yokohama (JP); Iwao Kunishima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/288,204

(22) Filed: Nov. 29, 2005

(65) Prior Publication Data
US 2007/0045687 A1 Mar. 1, 2007

(30) Foreign Application Priority Data
Aug. 30, 2005 (JP) ............................. 2005-249382

(51) Int. Cl.
*H01L 29/94* (2006.01)
(52) U.S. Cl. .................. 257/295; 257/43; 257/306; 438/3; 438/104
(58) Field of Classification Search ................ 438/104, 438/3; 257/43, 758, 295, 306
See application file for complete search history.

(56) References Cited

U.S. PATENT DOCUMENTS

| 5,661,345 | A * | 8/1997 | Wada et al. ................. 257/767 |
| 2002/0121699 | A1 * | 9/2002 | Cheng et al. ................. 257/758 |
| 2002/0132469 | A1 * | 9/2002 | Lee et al. .................... 438/628 |
| 2003/0001192 | A1 * | 1/2003 | Yamanobe ................... 257/310 |
| 2003/0027385 | A1 * | 2/2003 | Park et al. ................... 438/253 |
| 2003/0089954 | A1 * | 5/2003 | Sashida ....................... 257/369 |
| 2003/0216056 | A1 * | 11/2003 | Yoon .......................... 438/778 |
| 2004/0099893 | A1 * | 5/2004 | Martin et al. ................ 257/295 |
| 2005/0173799 | A1 * | 8/2005 | Jou et al. ..................... 257/751 |
| 2005/0199928 | A1 * | 9/2005 | Mikawa et al. ............. 257/295 |
| 2005/0224979 | A1 * | 10/2005 | Marathe et al. ............. 257/758 |
| 2006/0261483 | A1 * | 11/2006 | Tsumura et al. ............ 257/758 |

FOREIGN PATENT DOCUMENTS

JP 2001-291843 10/2001

OTHER PUBLICATIONS

U.S. Appl. No. 11/142,441, filed Jun. 2, 2005, Yoshinori Kumura, et al.

* cited by examiner

*Primary Examiner*—Matthew Smith
*Assistant Examiner*—Jae Lee
(74) *Attorney, Agent, or Firm*—Oblon, Spivak, McClelland, Maier & Neustadt, P.C.

(57) ABSTRACT

A semiconductor device comprising a ferroelectric capacitor having improved reliability is disclosed. According to one aspect of the present invention, it is provided a semiconductor device comprising a transistor formed on a semiconductor substrate, a ferroelectric capacitor formed above the transistor and comprising a lower electrode, a ferroelectric film and an upper electrode, a first hydrogen barrier film formed over the ferroelectric capacitor, an insulator formed over the first hydrogen barrier film, a contact plug disposed in the insulator and electrically connected with the upper electrode, a second hydrogen barrier film disposed between the contact plug and the insulator continuously, and a wiring connected with the contact plug.

1 Claim, 12 Drawing Sheets

SEMICONDUCTOR DEVICE

CROSS REFERENCE TO RELATED APPLICATIONS

This application is based upon and claims the benefit of priority from the prior Japanese Patent Application No. 2005-249382, filed on Aug. 30, 2005, the entire contents of which are incorporated herein by reference.

BACKGROUND OF THE INVENTION

1. Field of the Invention

The present invention relates to a semiconductor device, and more particularly, it relates to a semiconductor device using a ferroelectric film.

2. Description of the Related Art

In a semiconductor device such as a ferro-electric random access memory (FeRAM) which uses a ferroelectric capacitor employing a ferroelectric film, if hydrogen and/or moisture penetrates the capacitor during, for example, a manufacturing process after the ferroelectric capacitor is formed, characteristics of the ferroelectric capacitor, especially polarization characteristics of the ferroelectric film are deteriorated, resulting in a problem.

A multilevel wiring using a copper wiring and a low dielectric constant insulator is used in a miniaturized ferroelectric random access memory. As the low dielectric constant insulator, there is used, e.g., an organic silicon oxide film (e.g., an SiOC film) or a fluoridated silicon oxide film (e.g., an SiOF film). These films are formed from an organic/inorganic material containing a CH-based or CF-based component as a source material by, e.g., plasma assisted chemical vapor deposition (plasma CVD). Various kinds of radicals such as H or F are generated to a great extent during plasma processing. As the low dielectric constant insulator is porous, the insulator is apt to absorb/adsorb the radicals and moisture as compared to a conventional interlevel insulator, e.g., a TEOS oxide film.

The low dielectric constant insulator even adsorbs hydrogen and/or moisture in a process after its formation. An example of the adsorption is explained below. An upper electrode of a ferroelectric capacitor is connected with a copper wiring through a contact plug provided in the low dielectric constant insulator. The contact plug and the copper wiring are covered with a barrier metal film, e.g., tantalum (Ta) or tantalum nitride (TaN), which prevents copper from diffusing out. Even in a process of forming the barrier metal, the copper wiring or the like, the low dielectric constant insulator is exposed to a processing atmosphere containing hydrogen and/or moisture, thereby absorbing/adsorbing hydrogen and/or moisture.

In order to prevent hydrogen and/or moisture absorbed/adsorbed in the low dielectric constant insulator from penetrating the ferroelectric capacitor, the ferroelectric capacitor is generally covered with a hydrogen barrier film. However, since the contact plug is not covered with the hydrogen barrier film, hydrogen and/or moisture may possibly penetrate into the ferroelectric capacitor through the contact plug.

A semiconductor device comprising a hydrogen barrier film formed in a contact plug portion is disclosed in Jpn. Pat. Appln. KOKAI Publication No. 2001-291843. In the semiconductor device, prior to forming a ferroelectric capacitor, first, nitrogen is plasma-doped on a surface of a first insulator where the ferroelectric capacitor will be formed thereon, thereby forming a first hydrogen barrier film consisting of a nitride of the first insulator. After forming the ferroelectric capacitor, a second insulator is formed over the entire ferroelectric capacitor, and nitrogen is plasma-doped on a surface of the second insulator to form a second hydrogen barrier film consisting of a nitride of the second insulator. Then, a third insulator which functions as an interlevel insulator is formed over the ferroelectric capacitor. A contact hole reaching the ferroelectric capacitor is formed through the third and second insulators, and nitrogen is similarly plasma-doped on an inner surface of the contact hole, thereby forming a third hydrogen barrier film consisting of a nitride of the third insulator.

It is said that a thickness of the hydrogen barrier film formed by plasma doping roughly corresponds to a couple of atomic layers, and thus it is not thick. Therefore, there is a problem of hydrogen barrier properties at a contact portion between the second and third hydrogen barrier film on an inner surface of the contact hole. Further, when a porous low dielectric constant insulator is used as the third insulator, there could be a problem whether the hydrogen barrier film can be sufficiently formed on a porous surface of the low dielectric constant insulator having complicated shapes.

BRIEF SUMMARY OF THE INVENTION

According to one aspect of the present invention, it there is provided a semiconductor device including: a transistor formed on a semiconductor substrate; a ferroelectric capacitor formed above the transistor and including a lower electrode, a ferroelectric film and an upper electrode; a first hydrogen barrier film formed over the ferroelectric capacitor; an insulator formed over the first hydrogen barrier film; a contact plug disposed in the insulator and electrically connected with the upper electrode; a second hydrogen barrier film disposed continuously between the contact plug and the insulator; and a wiring connected with the contact plug.

According to another aspect of the present invention, there is provided a semiconductor device including: a transistor formed on a semiconductor substrate; a ferroelectric capacitor formed above the transistor and including a lower electrode, a ferroelectric film and an upper electrode; a first insulator formed over the ferroelectric capacitor; a first wiring formed above the ferroelectric capacitor; a second insulator formed over the first wiring; a second wiring formed above the first wiring; a contact plug disposed in the second insulator and electrically connecting the first and second wirings; a first hydrogen barrier film disposed continuously between the contact plug and the second insulator; and a second hydrogen barrier film formed on the second insulator.

DETAILED DESCRIPTION OF THE INVENTION

Figure 1:
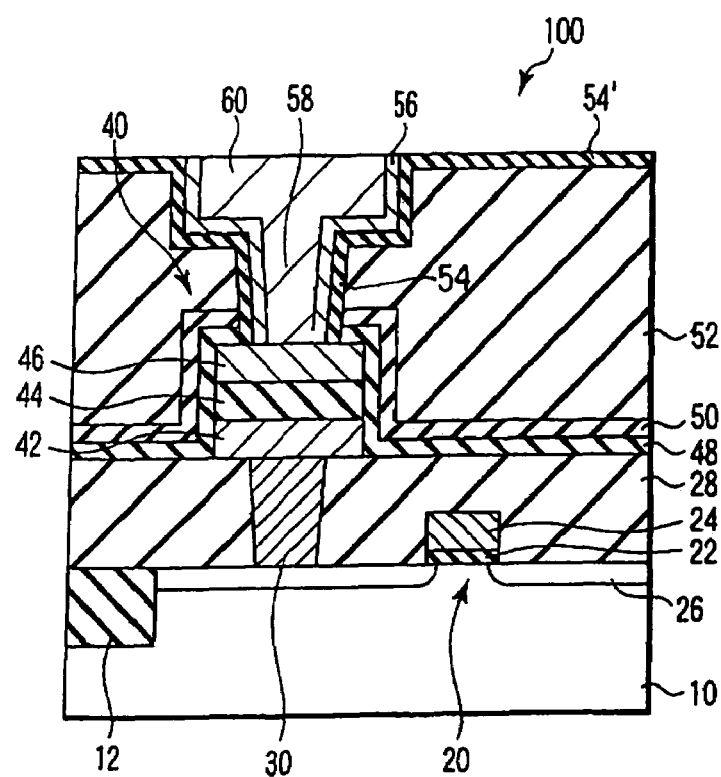
FIG. 1 is a cross-sectional view illustrating an example of a semiconductor device according to a first embodiment of the present invention.

The embodiments of the present invention will be described with reference to the accompanying drawings. Throughout the drawings, corresponding portions are denoted by corresponding reference numerals. Each of the following embodiments is illustrated by way of example, however, the present invention can be variously modified and implemented without departing from the spirit of the present invention.

The present invention is directed to a semiconductor device including a configuration in which side surfaces of a contact plug are continuously covered with a hydrogen barrier film and the contact plug is connected with an upper electrode of a ferroelectric capacitor, and a manufacturing method thereof. The present invention is further directed to a semiconductor device and a manufacturing method thereof which prevent hydrogen, moisture and/or the like from penetrating to the ferroelectric capacitor from outside thereof including a contact plug portion, thereby improving reliability of the semiconductor device. Embodiments of the present invention will now be described hereinafter in detail using a semiconductor storage device as an example.

FIRST EMBODIMENT

FIG. 1 shows an example of a cross-sectional configuration of a semiconductor storage device 100 according to a first embodiment of the present invention. This embodiment is a semiconductor device comprising a configuration in which a second hydrogen barrier film 54 continuously covers side surfaces of a second contact plug 58 which is connected with an upper electrode 46 of a ferroelectric capacitor 40 and side and bottom surfaces of a wiring 60. The second hydrogen barrier film 54' is formed to extend on a surface of a second interlevel insulator 52. Furthermore, an upper surface (excluding a portion of the second contact plug 58) and side surfaces of the ferroelectric capacitor 40 are surrounded by a first hydrogen barrier film 50. With such a configuration, after forming the ferroelectric capacitor 40, hydrogen, moisture and/or the like can be prevented from penetrating to the ferroelectric capacitor 40 from outside thereof including the second contact plug 58 portion, thereby improving characteristics and reliability of the semiconductor device.

An example of a manufacturing method of the semiconductor storage device 100 according to the present invention will now be described hereinafter with reference to cross-sectional views shown in FIGS. 2A to 2G.

Figure 2A:
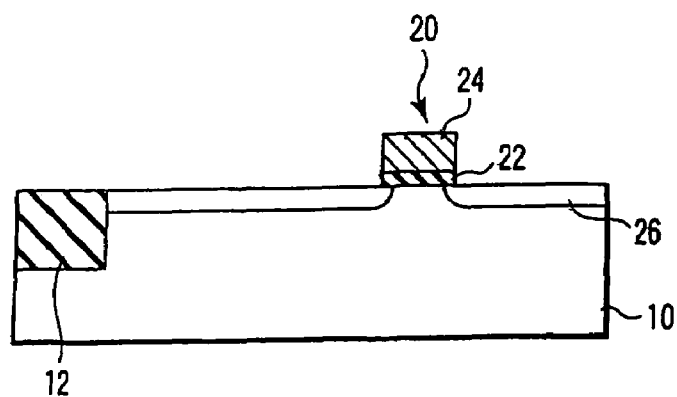
FIGS. 2A to 2G are process cross-sectional views illustrating an example of a manufacturing method of the semiconductor device according to the first embodiment.

(1) First, as shown in FIG. 2A, an MOS transistor 20 is formed on a semiconductor substrate 10.

Referring to FIG. 2A, a well (not shown) and isolation 12 are formed in the semiconductor substrate 10, e.g., a silicon substrate 10. Then, a gate insulator 22 is formed on an entire surface of the silicon substrate 10. As the gate insulator, a silicon oxide film ($SiO_2$), a silicon nitride film (SiN), a silicon oxynitride film (SiON), a high-dielectric-constant insulator having a dielectric constant higher than that of $SiO_2$, or the like can be used. On the gate insulator 22, an electroconductive material for a gate electrode 24 is deposited, e.g., polycrystal silicon doped with a high concentration of phosphorous (P), a high-melting point metal such as tungsten (W) or molybdenum (Mo), or a silicide of these metals. The electroconductive material for a gate electrode is patterned to form a gate electrode 24 by lithography and etching. A source/drain 26 is formed by doping a high concentration of, for example, arsenic (As) by ion implantation using the gate electrode 24 as a mask. In this way, the MOS transistor 20 shown in FIG. 2A can be formed on the semiconductor substrate 10.

Figure 2B:
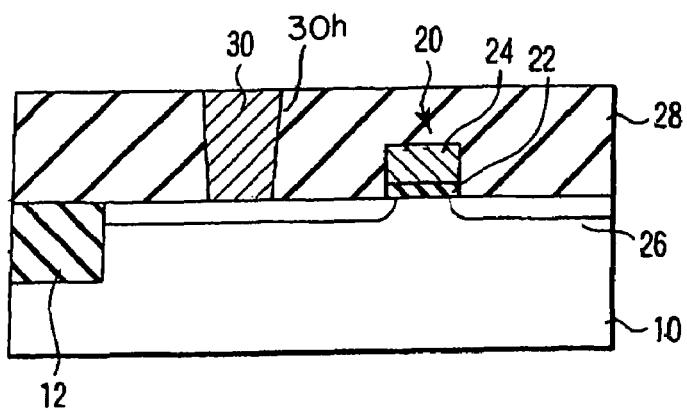

(2) Then, as shown in FIG. 2B, a first interlevel insulator 28 is being formed over the MOS transistor 20 and planarized, and then a first contact plug 30 is formed.

Referring to FIG. 2B, a first interlevel insulator 28 is deposited on an entire surface over the MOS transistor 20, and a surface of the first interlevel insulator 28 is then planarized by, e.g., chemical-mechanical polishing (CMP). As the first interlevel insulator 28, boron phosphorous silicate glass (BPSG) or plasma-assisted tetra ethoxy silane (P-TEOS), for example, can be used.

A first contact hole 30h reaching the source/drain 26 is formed in the first interlevel insulator 28 by lithography and etching. For example, tungsten (W) or phosphorous-doped polycrystal silicon is deposited to fill the contact hole 30h. Then, tungsten or phosphorous-doped polycrystal silicon deposited on the surface of the first interlevel insulator 28 is removed by CPM with the first interlevel insulator 28 being used as a stopper, thereby forming the first contact plug 30.

In this way, the first contact plug 30 can be formed as shown in FIG. 2B.

Figure 2C:
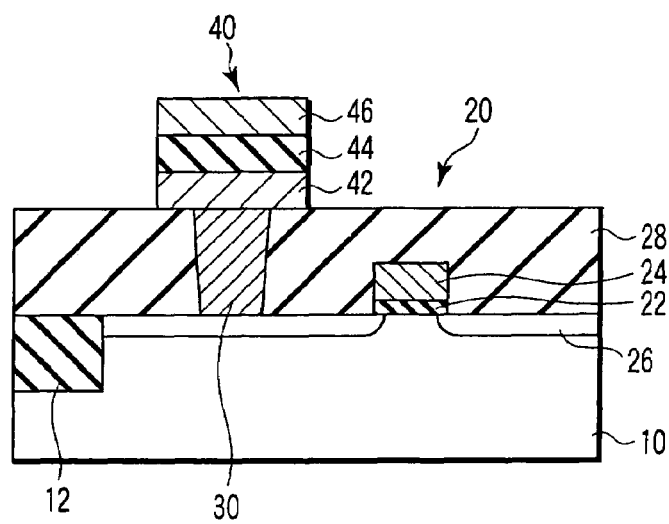

(3) Then, as shown in FIG. 2C, a ferroelectric capacitor 40 is formed on the first contact plug 30.

Referring to FIG. 2C, materials which become a lower electrode 42, a ferroelectric film 44 and an upper electrode 46 of a ferroelectric capacitor 40 are sequentially deposited on the entire surface of the first interlevel insulator 28 including on the first contact plug 30. As the lower electrode 42 of the ferroelectric capacitor 40, an electroconductive film capable of preventing an oxygen from diffusing is preferable, and can be, for example, platinum (Pt), iridium (Ir), iridium oxide ($IrO_2$), strontium ruthenium oxide (Sr-RuO), ruthenium (Ru), ruthenium oxide ($RuO_2$) or the like or a laminated film of these materials. As the ferroelectric film 44, a metal oxide having a perovskite structure, e.g., lead zirconate titanate (PZT) or strontium bismuth tantalate (SBT) can be used. As the upper electrode 46, Pt, Ir, $IrO_2$, SrRuO, Ru, $RuO_2$, or a laminated film of these materials, for example, can be used. Then, the upper electrode material, the ferroelectric film material and lower electrode material are sequentially patterned by etching to form the ferroelectric capacitor 40 connected with the first contact plug 30.

In this way, as shown in FIG. 2C, the ferroelectric capacitor 40 can be formed.

Figure 2D:
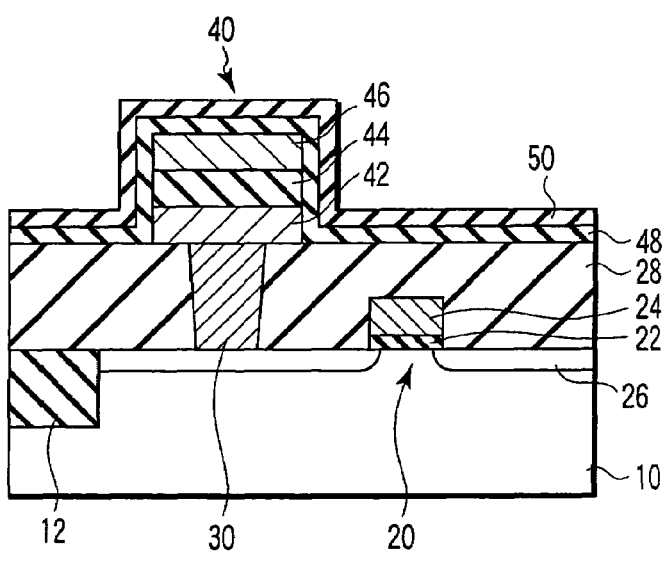

(4) Next, as shown in FIG. 2D, a first hydrogen barrier film 50 is formed to cover the ferroelectric capacitor 40.

Referring to FIG. 2D, first, a first insulator 48 is formed to cover the ferroelectric capacitor 40 if required. As the first insulator 48, for example, $SiO_2$ or silicon nitride (SiN) can be used. A first hydrogen barrier film 50 is deposited on the entire surface of the first insulator 48. With such a configuration, even if etching residue is formed on side surfaces of the ferroelectric capacitor 40, the first hydrogen diffusion barrier film 50 formed on the first insulator 48 can cover superiorly the ferroelectric capacitor 40 without being affected by the etching residue. The first hydrogen barrier film 50 can prevent hydrogen and/or moisture from diffusing and penetrating the ferroelectric capacitor 40 in subsequent steps such as forming a multilevel wiring or the like. As the first hydrogen barrier film, aluminum oxide ($Al_2O_3$), SiN, silicon oxynitride (SiON), titanium oxide ($TiO_2$) or the like, for example, can be used.

In this way, as shown in FIG. 2D, the first insulator 48 and the first hydrogen barrier film 50 can be formed on the surface of the ferroelectric capacitor 40. It is to be noted that the first insulator 48 can be eliminated as described above.

Figure 2E:
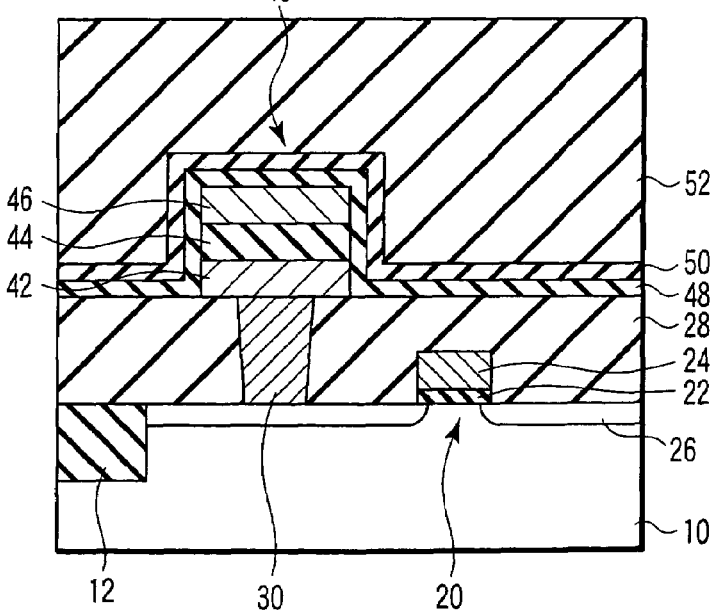

(5) Then, as shown in FIG. 2E, a second interlevel insulator 52 is deposited over the ferroelectric capacitor 40 and then a surface thereof is planarized.

Referring to FIG. 2E, the second interlevel insulator 52 is thickly deposited to fill spaces between the ferroelectric capacitors 40, and the second interlevel insulator 52 is planarized by, e.g., CMP so that the ferroelectric capacitor 40 is buried with the second interlevel insulator 52. As a material for the second interlevel insulator 52, P-TEOS, $O_3$-TEOS, spin on glass (SOG), or a low-dielectric-constant insulator such as a fluoridated silicon oxide film (SiOF) or an organic silicon oxide film, for example, can be used. When a wiring is formed as a multilevel wiring, a low dielectric constant insulator is preferably used.

In this way, as shown in FIG. 2E, the ferroelectric capacitor 40 can be covered with the second interlevel insulator 52 the surface of which is planarized.

Figure 2F:
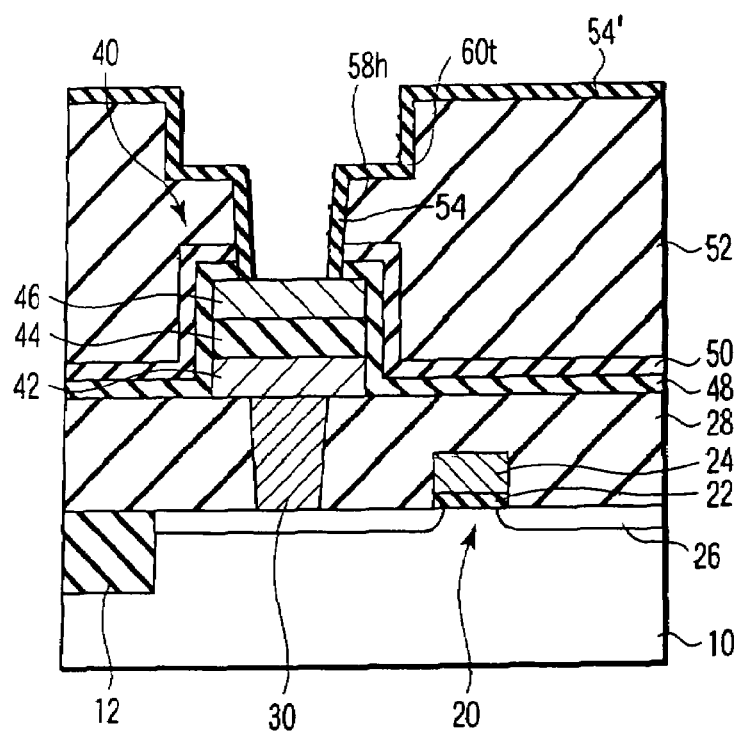

(6) Then, as shown in FIG. 2F, a second contact hole 58h and wiring groove 60t are formed to connect a wiring with the upper electrode 46 of the ferroelectric capacitor 40, and a second hydrogen barrier film 54 is formed on inner surfaces of the second contact hole 58h and wiring groove 60t.

Referring to FIG. 2F, the second contact hole 58h reaching the upper electrode 46 of the ferroelectric capacitor 40 and the wiring groove 60t are formed in the second interlevel insulator 52, the first hydrogen barrier film 50 and the first insulator 48 by lithography and etching.

Then, a second hydrogen barrier film 54 is continuously formed on the inner surfaces of the second contact hole 58h and wiring groove 60t. As the second hydrogen barrier film 54, for example, $Al_2O_3$, $TiO_2$ or SiN can be used like the first hydrogen barrier film 50. The second hydrogen barrier film 54 can be formed by combining, e.g., atomic layer deposition (ALD) with sputtering. The ALD has excellent step coverage, and the sputtering has selectivity in a depositable film thickness. Specifically, at first, the second hydrogen barrier film 54 with a substantially uniform thickness is formed by ALD on side and bottom surfaces of the second contact hole 58h and wiring groove 60t. Then an additional second hydrogen barrier film 54 is selectively formed thickly by sputtering on the bottom surfaces of the wiring groove 60t and second contact hole 58h, and 54' on the surface of the second interlevel insulator 52.

A deposited film thickness is thinner on the narrow and deep bottom of the second contact hole 58h than the others. As a result, a deposited total film thickness is thicker on the bottom of the wiring groove 60t and on the surface of the second interlevel insulator 52 relative to the thickness on the bottom of the contact hole 58h.

Thereafter, the second hydrogen barrier film 54 formed on the bottom of the second contact hole 58h is removed by anisotropic etching to expose the upper electrode 46 of the ferroelectric capacitor 40. During the anisotropic etching, the second hydrogen barrier film 54 and 54' can remain on the bottom of the wiring groove 60t and on the second interlevel insulator 52, because the film thickness of the second hydrogen barrier film 54 and 54' is thicker as described above. As a result, the second hydrogen barrier film 54 and 54' can be continuously formed on the side surfaces of the second contact hole 58h, the bottom and side surfaces of the wiring groove 60t and the surface of the second interlevel insulator 52. Then, annealing is carried out for, e.g., one hour in an atmosphere containing oxygen, such as in oxygen, at a high temperature, e.g., at 650° C.

In this way, as shown in FIG. 2F, the second contact hole 58h and wiring groove 60t can be formed for a connection to the upper electrode 46 of the ferroelectric capacitor 40, and the second hydrogen barrier film 54 can be continuously formed on the inner surfaces thereof.

According to this embodiment, even when a porous low dielectric constant insulator is used as the second interlevel insulator 52, the second hydrogen barrier film 54 can be formed to cover pores on the inner surfaces of the second contact hole 58h and wiring groove 60t as described above, and can ensure barrier properties against penetration of hydrogen and/or moisture into the contact plug and/or the wiring.

(7) Then, a second contact plug 58 and wiring 60 connecting with the upper electrode 46 of the ferroelectric capacitor 40 are formed.

Figure 2G:
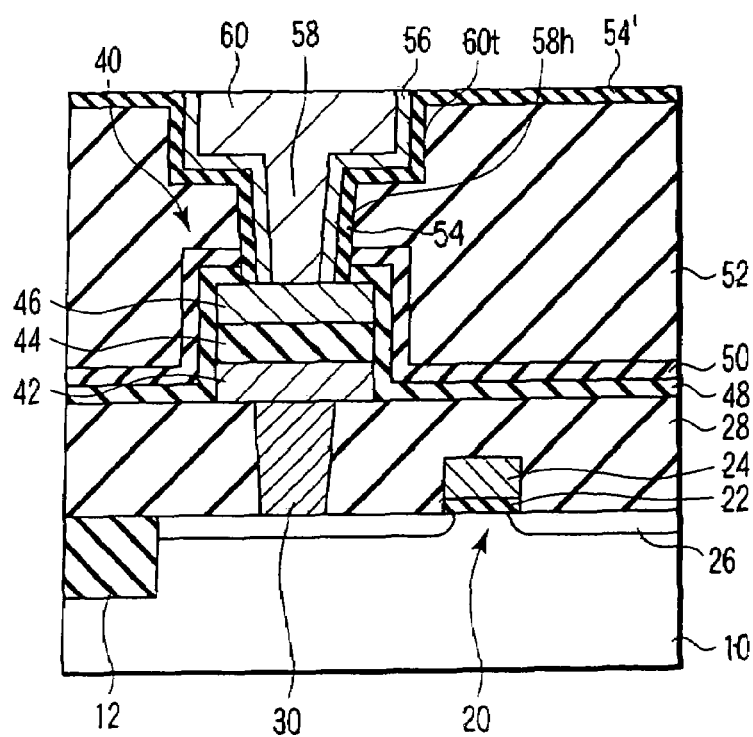

Referring to FIG. 2G, a barrier metal 56 is formed on the second hydrogen barrier film 54 in the second contact hole 58h and wiring groove 60t. The barrier metal 56 prevents a wiring material from diffusing out, and can be, e.g., tantalum (Ta), tantalum nitride (TaN) or titanium nitride (TiN).

A electroconductive material for the second contact plug 58 and wiring 60 is deposited on the barrier metal 56 to fill the second contact hole 58h and wiring groove 60t. As the electroconductive material, tungsten (W), aluminum (Al), copper (Cu), titanium (Ti), titanium nitride (TiN), tantalum (Ta), tantalum nitride (TaN) or a material containing any of these substances, for example, can be used. The electroconductive material can be formed by, e.g., metal organic CVD (metal organic chemical vapor deposition: MOCVD), sputtering, electrolytic plating, sputter/reflow and the like.

Then the electroconductive material deposited on the surface is removed by, e.g., CMP with the second hydrogen barrier film 54 being used as a stopper. In this way, the second contact plug 58 and wiring 60 connected with the upper electrode 46 of the ferroelectric capacitor 40 are formed, as shown in FIG. 2G. It is to be noted that, if Cu is used as the wiring material, the second contact plug 58 and wiring 60 can be simultaneously formed by, e.g., a dual damascene process.

Thereafter, a process required for the semiconductor device, e.g., a multilevel wiring, is carried out to bring the semiconductor storage device 100 including the ferroelectric random access memory to completion.

In the thus formed semiconductor device, side surfaces of the second contact plug 58 and wiring 60 are continuously covered with the second hydrogen barrier film 54. Further, the surface of the second interlevel insulator 52 and peripheral surfaces of the ferroelectric capacitor 40 are also covered with the first and second hydrogen barrier films 50 and 54. As a result, hydrogen, moisture and/or the like can be prevented from penetrating the ferroelectric capacitor 40 through the wiring 60 and second contact plug 58. Therefore, damage to the ferroelectric capacitor 40 can be avoided in a process after the ferroelectric capacitor 40 is formed.

As described above, this embodiment results in preventing hydrogen, moisture and/or the like from penetrating to the ferroelectric capacitor from outside thereof including the contact plug portion.

SECOND EMBODIMENT

Figure 3:
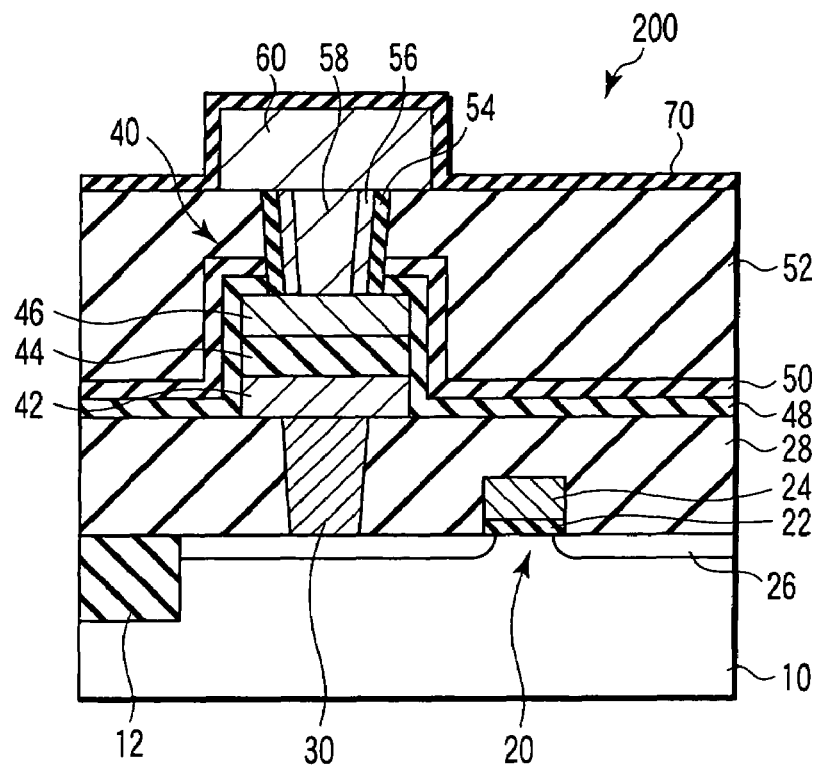
FIG. 3 is a cross-sectional view illustrating an example of a semiconductor device according to a second embodiment of the present invention.

FIG. 3 shows an example of a cross-sectional configuration of a semiconductor storage device 200 according to a second embodiment. In this embodiment, the semiconductor device 200 includes a second hydrogen barrier film 54 formed to continuously cover side surfaces of a second contact plug 58 and a fourth hydrogen barrier film 70 formed to cover a wiring 60 on a second interlevel insulating film 52. With such a configuration, hydrogen, moisture and/or the like can be prevented from penetrating to a ferroelectric capacitor 40 from outside thereof including the second contact plug portion 58 after the ferroelectric capacitor 40 is formed, thereby improving characteristics and reliability of the semiconductor storage device.

An example of a manufacturing method of the semiconductor device 200 according to this embodiment will now be described with reference to process cross-sectional views illustrated in FIGS. 4A to 4D.

Figure 4A:
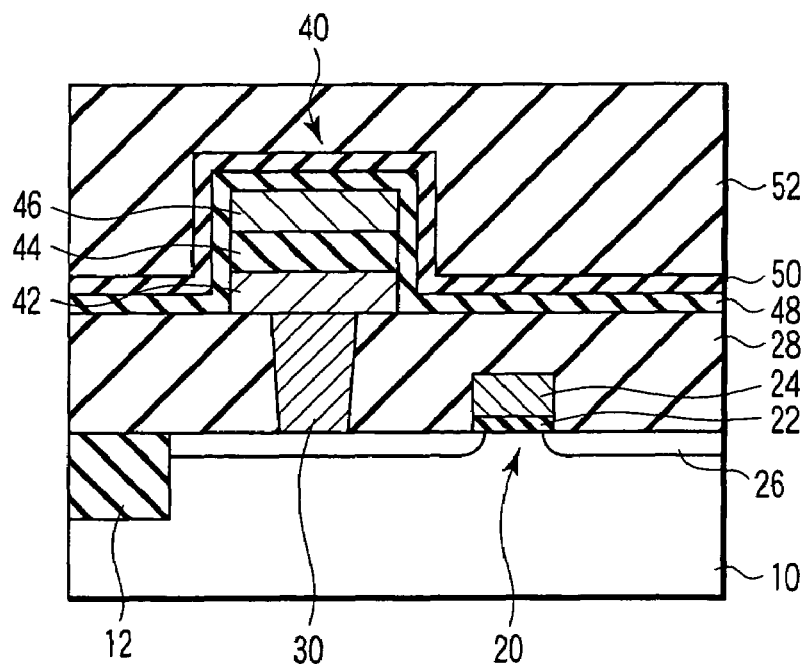
FIGS. 4A to 4D are process cross-sectional views illustrating an example of a manufacturing method of the semiconductor device according to the second embodiment.

Because steps of forming the second interlevel insulator 52 formed to cover the ferroelectric capacitor 40 and planarizing the same are the same as the steps (1) to (5) in the first embodiment, the description of those steps is omitted. However, a thickness of the second interlevel insulator 52 in this embodiment is reduced as compared with that of the first embodiment. FIG. 4A is a view showing that the second interlevel insulator 52 is planarized, and that it is substantially the same as FIG. 2E.

Figure 4B:
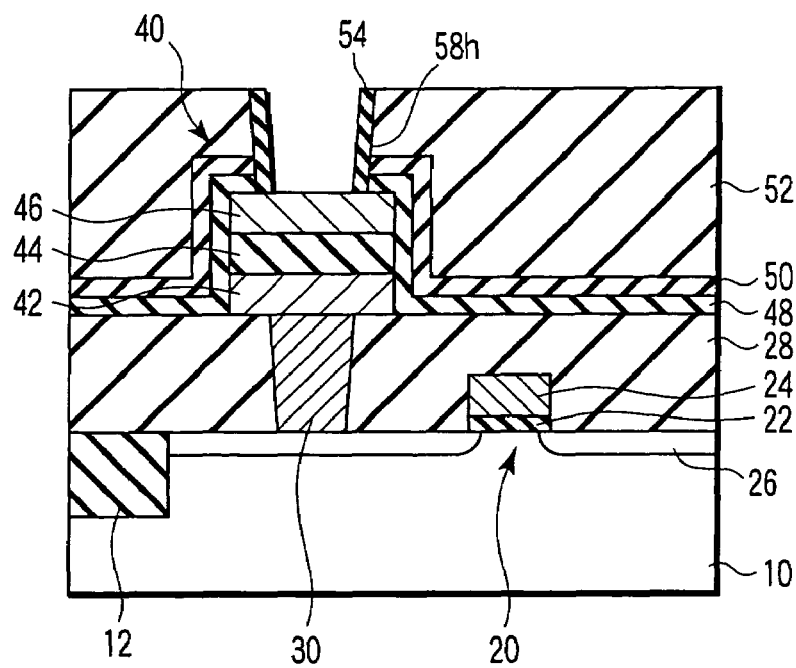

(1) Here, as shown in FIG. 4B, a second contact hole 58h to connect a wiring with an upper electrode 46 of the ferroelectric capacitor 40 is formed, and a second hydrogen barrier film 54 is formed on inner surfaces of the second contact hole 58h.

Referring to FIG. 4B, the second contact hole 58h reaching the upper electrode 46 is formed in a second interlevel insulator 52, a first hydrogen barrier film 50 and a first insulator 48 are formed on the ferroelectric capacitor 40 by lithography and etching.

Then, the second hydrogen barrier film 54 is continuously formed on the inner surfaces of the second contact hole 58h. Although the second hydrogen barrier film 54 according to this embodiment is deposited to extend on the second interlevel insulator 52 from inside of the second contact hole 58h, the second hydrogen barrier film 54 on the surface of the second interlevel insulator 52 is removed as will be described later. The second hydrogen barrier film 54 can be, for example, $Al_2O_3$, $TiO_2$ or SiN, like in the first embodiment, and, in addition, an electroconductive film having high hydrogen barrier properties, e.g., TiAlN or TiN can be used as well. Then, the second hydrogen barrier film 54 formed on a bottom of the second contact hole 58h and the surface of the second interlevel insulator 52 is removed by anisotropic etching. Subsequently, annealing is carried out in an atmosphere containing oxygen at a high temperature, e.g., in oxygen at 650° C. for one hour.

In this way, as depicted in FIG. 4B, the second contact hole 58h for connection with the upper electrode 46 of the ferroelectric capacitor 40 can be formed, and the second hydrogen barrier film 54 can be formed only on the side surfaces of the second contact hole 58h.

Figure 4C:
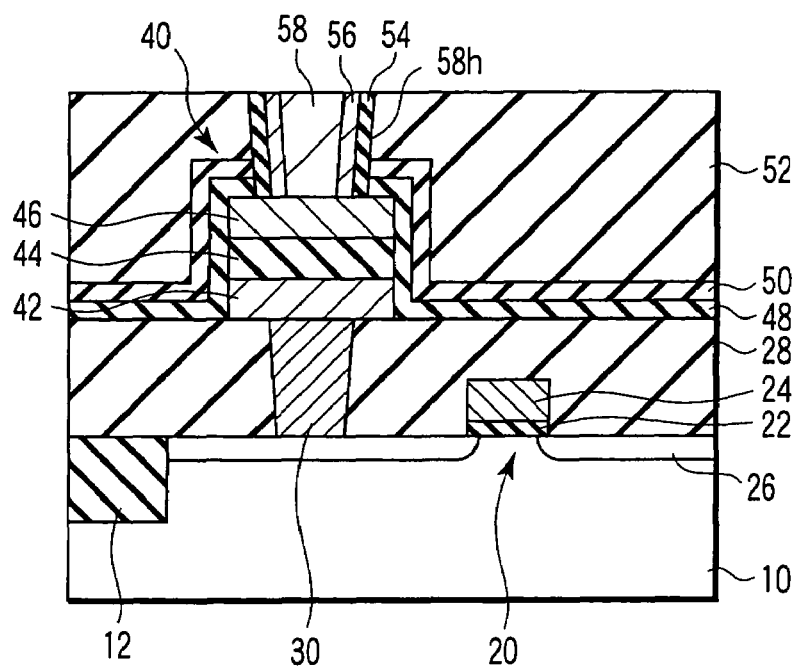

(2) Then, as shown in FIG. 4C, a second contact plug 58 connected to the upper electrode 46 of the ferroelectric capacitor 40 is formed.

Referring to FIG. 4C, a barrier metal 56 is formed on the second hydrogen barrier film 54 in the second contact hole 58h, if required. As the barrier metal 56, Ta, TaN, TiN, or the like, can be used as in the first embodiment.

A electroconductive material for the second contact plug 58 is deposited on the barrier metal 56. As the electroconductive material, W, Al, Cu, Ti, TiN, Ta, TaN, a material containing any of these substances, or the like can be used. The electroconductive material can be formed by a method such as MOCVD, sputtering, plating, sputter-reflow and others. Then, the electroconductive material deposited on the surface is removed by, e.g., CMP with the barrier metal 56 being used as a stopper. Furthermore, the barrier metal 56 on the second interlevel insulator 52 is removed.

In this way, the second contact plug 58 connected with the upper electrode 46 of the ferroelectric capacitor 40 shown in FIG. 4C can be formed. The side surfaces of the second contact plug 58 are continuously covered with the second hydrogen barrier film 54.

Figure 4D:
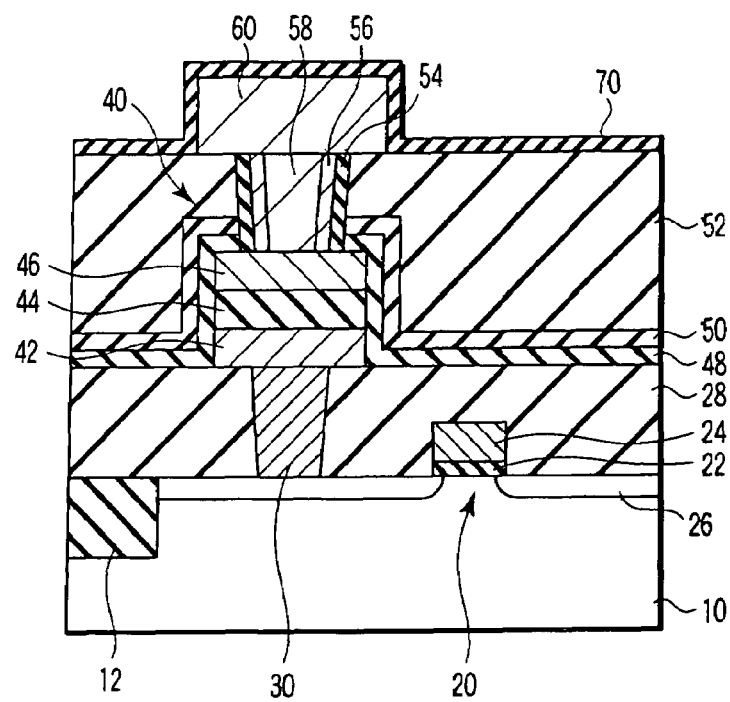

(3) Then, as shown in FIG. 4D, a wiring 60 connected with the second contact plug 58 is formed, and a fourth hydrogen barrier film 70 covering the wiring 60 is formed.

Referring to FIG. 4D, a wiring material is deposited on the entire surface of the second interlevel insulator 52 including on the second contact plug 58. As the wiring material, the same material as the electroconductive material of the second contact plug 58 mentioned above can be used. The wiring material is patterned by lithography and etching to form a wiring 60.

Moreover, a fourth hydrogen barrier film 70 is formed to cover the wiring 60. As the fourth hydrogen barrier film 70, $Al_2O_3$, $TiO_2$, SiN, or the like can be used, same as the first hydrogen barrier film 50.

In this way, the wiring 60 connected with the second contact plug 58 can be formed, and the fourth hydrogen barrier film 70 covering the wiring 60 can be formed as shown in FIG. 4D.

Thereafter, a process required for the semiconductor device, e.g., providing multilevel wiring is carried out to complete the semiconductor storage device 200 including the ferroelectric memory.

In the thus formed semiconductor device, the side surfaces of the second contact plug 58 are continuously covered with the second hydrogen barrier film 54. Furthermore, the surface of the second interlevel insulator 52 including the surface of the wiring 60 formed thereon is covered with the fourth hydrogen barrier film 70, and the peripheral surfaces of the ferroelectric capacitor 40 is also covered with the first hydrogen barrier film 50. As a result, hydrogen, moisture and/or the like can be prevented from penetrating to the ferroelectric capacitor 40 through the wiring 60 and second contact plug 58, and penetrating to the ferroelectric capacitor 40 from outside thereof. Therefore, damage to the ferroelectric capacitor 40 can be avoided in a process after the ferroelectric capacitor 40 is formed.

As described above, this embodiment results in preventing hydrogen, moisture and/or the like from penetrating to the ferroelectric capacitor from outside thereof including the contact plug portion.

THIRD EMBODIMENT

In the first embodiment, if Cu is used as the wiring material, for example, a dual damascene process is used. As shown in a cross-sectional view of FIG. 5, a third embodiment is directed to a semiconductor device 300 and a manufacturing method thereof which separately form a second contact plug 58 and a wiring 60 in a single damascene process.

An example of manufacturing method of this embodiment will now be described below with reference to cross-sectional views shown in FIGS. 6A to 6C while focusing on a difference from the first embodiment.

Figure 6A:
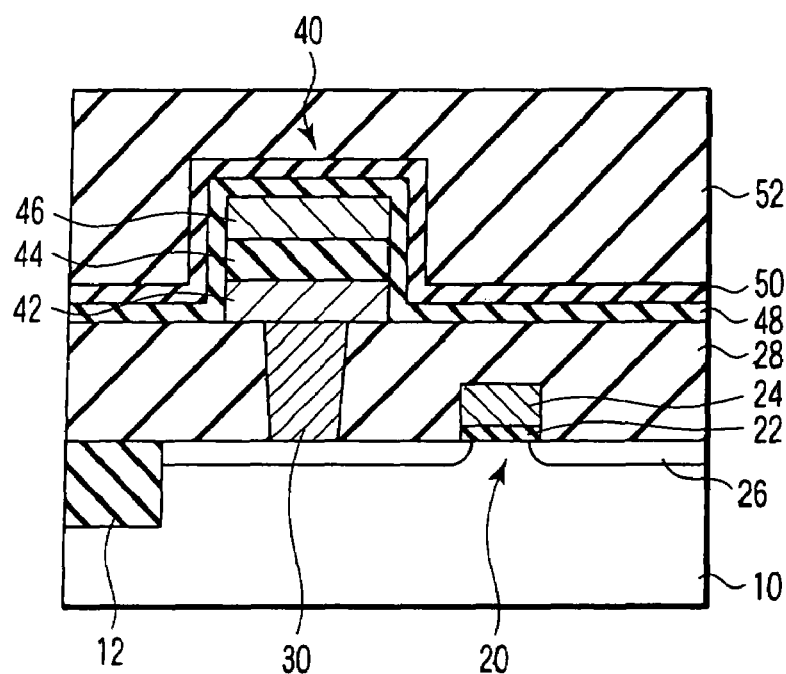
FIGS. 6A to 6C are cross-sectional views illustrating an example of a manufacturing method of the semiconductor device according to the third embodiment.

FIG. 6A is a view in which a second interlevel insulator 52 formed over a ferroelectric capacitor 40 is planarized, same as FIG. 4A.

Figure 6B:
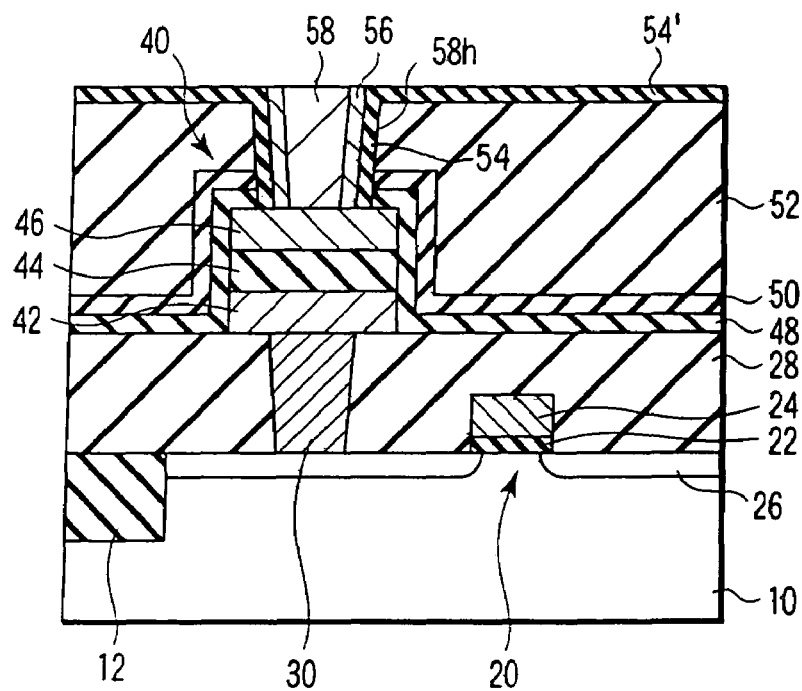

(1) Here, as shown in FIG. 6B, a second contact plug 58 to connect a wiring with an upper electrode 46 of the ferroelectric capacitor 40 is being formed. In the embodiment, a second hydrogen barrier film 54 and 54' is continuously formed on inner surfaces of the second contact hole 58h and a surface of the second interlevel insulator 52.

Referring to FIG. 6B, a second contact hole 58h reaching an upper electrode 46 is formed by lithography and etching in the second interlevel insulator 52, a first hydrogen barrier film 50 and a first insulator 48 formed on the ferroelectric capacitor 40.

Then, the second hydrogen barrier film 54 is continuously formed on the inner surfaces of the second contact hole 58h. The second hydrogen barrier film 54' is also extended on the surface of the second interlevel insulator 52. As in the first embodiment, the second hydrogen barrier film 54 and 54' is formed by a combination of, e.g., ALD and sputtering in such a manner that it is thin on a bottom surface of the second contact hole 58h and it is thick on the surface of the second interlevel insulator 52. Then, the second hydrogen barrier film 54 formed on the bottom surface of the second contact hole 58h is removed by anisotropic etching.

In this way, the second hydrogen barrier film 54 and 54' is continuously formed on the side surfaces of the second contact plug 58 and the surface of the second interlevel insulator 52. Then, annealing is carried out in an atmosphere containing oxygen at a high temperature, e.g., in oxygen at 650° C. for one hour.

Subsequently, a barrier metal 56 is formed on the second hydrogen barrier film 54 in the second contact hole 58h. Then, Cu, which becomes a second contact plug 58, is deposited on the barrier metal 56 by, e.g., electrolytic plating. Cu and the barrier metal 56 formed on the surface are removed and planarized by, e.g., CMP, with the second hydrogen barrier film 54 being used as a stopper. Thereby, the second contact plug 58 connected with the upper electrode 46 of the ferroelectric capacitor 40 is formed.

In this way, the second contact plug 58 connected with the upper electrode 46 of the ferroelectric capacitor 40 depicted in FIG. 6B can be formed.

Figure 6C:
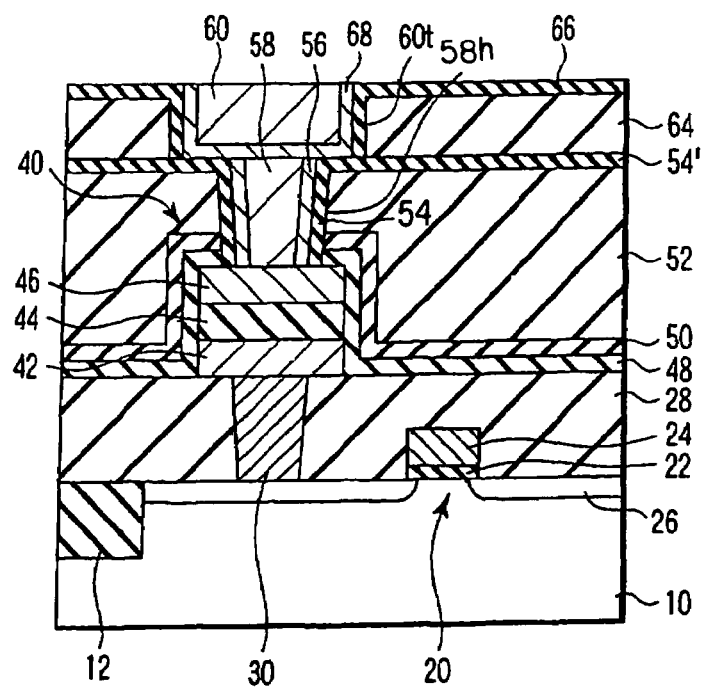

(2) Next, as shown in FIG. 6C, a third interlevel insulator 64 is formed and a wiring 60 connected with the second contact plug 58 is formed.

Referring to FIG. 6C, the third interlevel insulator 64 is formed on the entire surface on the second hydrogen barrier film 54' including an upper surface of the second contact plug 58. As the third interlevel insulator 64, it can be used, e.g., P-TEOS, $O_3$-TEOS, SOG, or a low-dielectric-constant insulator such as SiOF or SiOC, as in the case of the first and second interlevel insulators 28 and 52. If a wiring structure is to be formed in a multilevel wiring, a low-dielectric-constant insulator is preferably used. A wiring groove 60t is formed by lithography and etching in the third interlevel insulator 64 to expose the second contact plug 58.

Then, a third hydrogen barrier film 66 is continuously formed on inner surfaces of the wiring groove 60t. The third hydrogen barrier film 66 is also extended on the surface of the third interlevel insulator 64. Like the second hydrogen barrier film 54 and 54', the third hydrogen barrier film 66 is formed by a combination of, e.g., ALD and spluttering in such a manner that it is thinner on a bottom surface of the wiring groove 60t and it is thicker on the surface of the third interlevel insulator 64.

Where, on the bottom surface of the wiring groove 60t, the third hydrogen barrier film 66 is only formed on the second contact plug 58, while other than on the second contact plug 58, the second and third hydrogen barrier films 54' and 66 are formed on the second interlevel insulator 52. Therefore, a thickness of the hydrogen barrier film is thinner on the second contact plug 58 than on an area surrounding the second contact plug 58.

Then, the third hydrogen barrier film 66 formed on the bottom of the wiring groove 60t is removed by anisotropic etching to expose the upper surface of the second contact plug 58.

In this way, the third hydrogen barrier film 66 can be continuously formed on side surfaces of the wiring 60 and the surface of the third interlevel insulator 64 and is connected with the second hydrogen barrier film 54 formed on side surfaces of the second contact plug 58 at the bottom of the wiring groove 60t.

Then, a second barrier metal 68 is formed in the wiring groove 60t. And, Cu, which becomes the wiring 60, is deposited on the second barrier metal 68 by, e.g., electrolytic plating. Cu and the second barrier metal 68 formed on the surface are removed and planarized by, e.g., CMP with the third hydrogen barrier film 66 being used as a stopper. As a result, the wiring 60 connected with the upper electrode 46 of the ferroelectric capacitor 40 through the second contact plug 58 can be formed.

Figure 5:
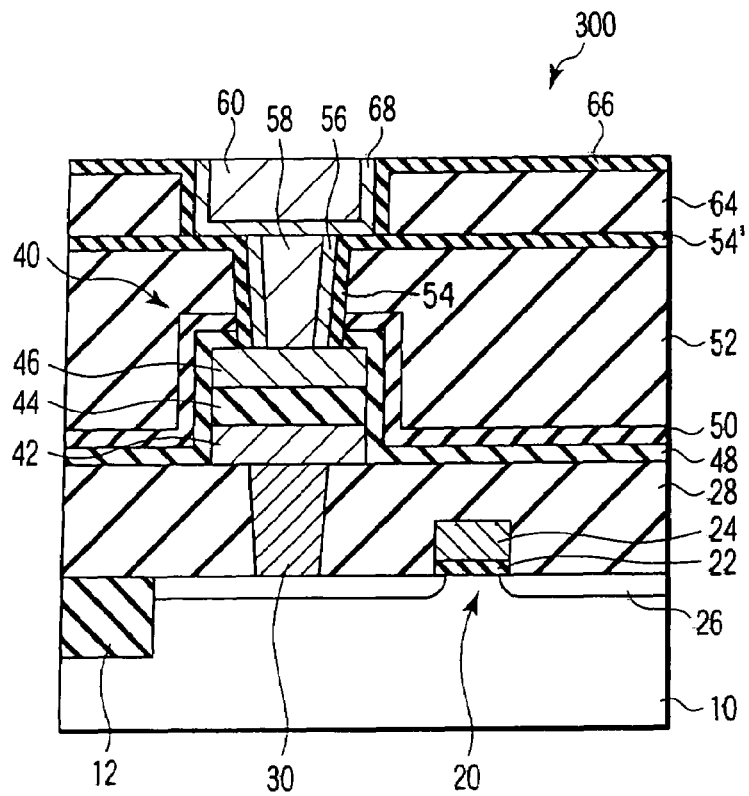
FIG. 5 is a cross-sectional view illustrating an example of a semiconductor device according to a third embodiment of the present invention.

In this way, the semiconductor storage device 300 in which the second contact plug 58 and wiring 60 connected with the upper electrode 46 of the ferroelectric capacitor 40 can be formed by the single damascene process, as shown in FIG. 5.

In the thus formed semiconductor device, the second contact plug 58 and wiring 60 are continuously covered with the second and third hydrogen barrier films 54 and 66. Furthermore, the second hydrogen barrier film 54' is also formed on an interface between the second and third interlevel insulators 52 and 64, and the third interlevel insulator 64 is covered with the third hydrogen barrier film 66. Moreover, the peripheral surfaces of the ferroelectric capacitor 40 are covered with a first hydrogen barrier film 50. As a result, hydrogen, moisture and/or the like can be prevented from penetrating to the ferroelectric capacitor 40 through the wiring 60 and second contact plug 58, and penetrating to the same from outside of the ferroelectric capacitor 40. Therefore, in a process after the ferroelectric capacitor 40 is formed, a damage given to the ferroelectric capacitor 40 can be suppressed.

As described above, this embodiment prevents hydrogen, moisture and/or the like from penetrating to the ferroelectric capacitor from outside thereof including the contact plug portion.

Various modifications to the present invention can be carried out. Some of the modifications will now be described hereinafter, but the present invention is not limited thereto.

FIRST MODIFICATION

A first modification to the present invention corresponds to a semiconductor storage device 410 obtained by modifying the first embodiment, in which a hydrogen barrier film around a second contact plug 58 and wiring 60 is formed like that in the single damascene process of the third embodiment.

Figure 7:
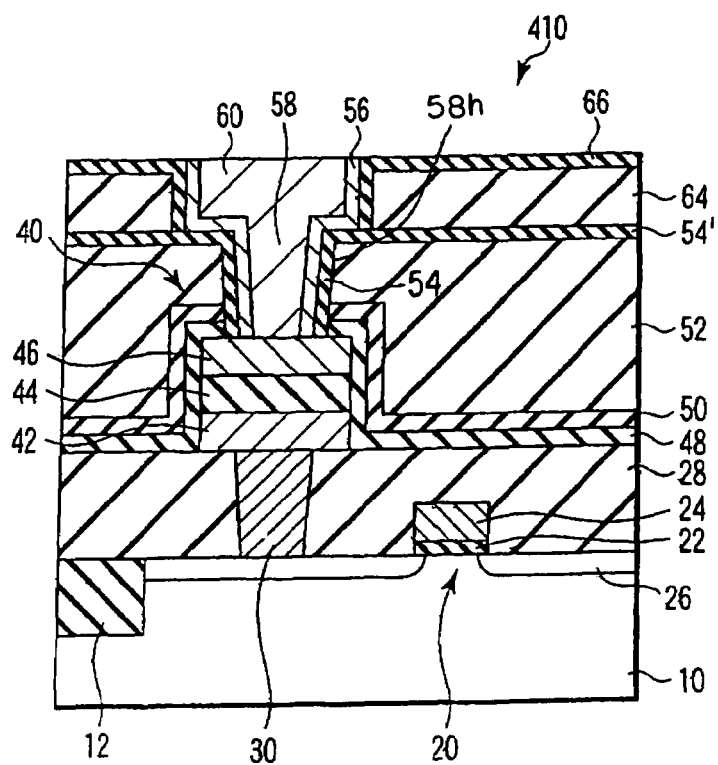
FIG. 7 is a cross-sectional view illustrating an example of a semiconductor device according to a first modification of the present invention.

FIG. 7 shows an example of a cross-sectional configuration of the semiconductor device 410 according to this modification. Peripheral surfaces of a ferroelectric capacitor 40 are surrounded by a first hydrogen barrier film 50. A second interlevel insulator 52 and a third interlevel insulator 64 are formed on the first hydrogen barrier film 50. A second contact plug 58 is formed in the second interlevel insulator 52 and a wiring 60 is formed in the third interlevel insulator 64. The second contact plug 58 and wiring 60 are simultaneously formed by a dual damascene process, being connected with an upper electrode 46 of the ferroelectric capacitor 40. The second contact plug 58 is formed in a second contact hole having a second hydrogen barrier film 54 and second barrier metal 56 thereon. The wiring 60 is formed in a wiring trench having a third hydrogen barrier film 66 and barrier metal 56 thereon. The second hydrogen barrier film 54 and 54' is formed to extend from on side surfaces of the second contact hole to on a surface of the second interlevel insulator 52. The third hydrogen barrier film 66 is formed to extend from on side surfaces of the wiring trench to on a surface of the third interlevel insulator 64 and is connected with the second hydrogen barrier film 54 on the bottom of the wiring trench.

In this way, according to this modification, the peripheral surfaces of the second contact plug 58 and wiring 60 being connected with the upper electrode 46 of the ferroelectric capacitor 40 can be continuously covered with the hydrogen barrier films 54 and 56. Furthermore, above the ferroelectric capacitor 40, the two hydrogen barrier films 54' and 66 are formed to cover the ferroelectric capacitor 40.

Therefore, this modification can prevent hydrogen, moisture and/or the like from penetrating to the ferroelectric capacitor from outside thereof including the contact plug portion.

SECOND MODIFICATION

A second modification of the present invention corresponds to a semiconductor storage device 420 in which a fourth hydrogen barrier film 70 is additionally formed on the wiring 60 in the first embodiment.

Figure 8:
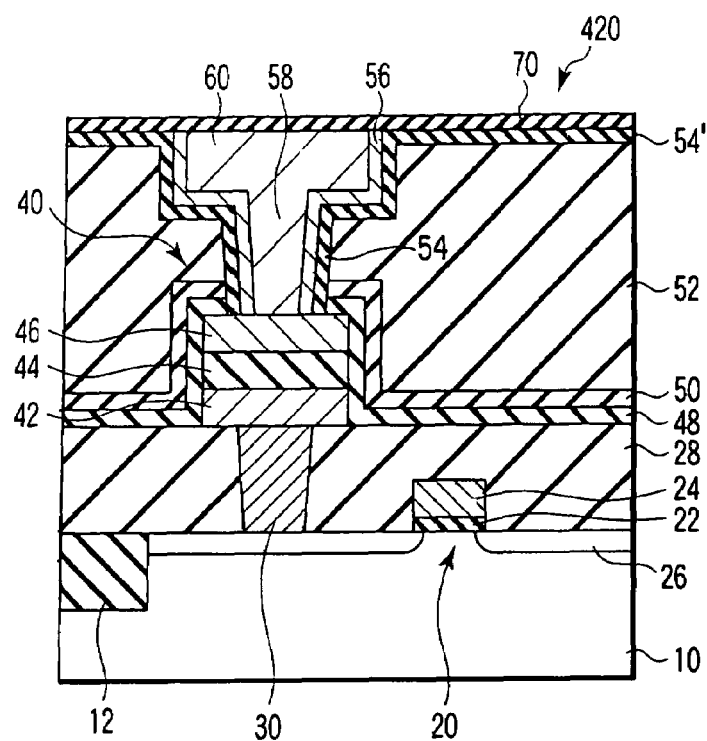
FIG. 8 is a cross-sectional view illustrating an example of a semiconductor device according to a second modification of the present invention.

FIG. 8 shows an example of a cross-sectional configuration of the semiconductor device 420 according to this modification. As in the first embodiment, a second contact plug 58 and wiring 60 being connected with an upper electrode 46 of a ferroelectric capacitor 40 are formed in a second interlevel insulator 52 formed over the ferroelectric capacitor 40 through a second hydrogen barrier film 54 and barrier metal 56 by a dual damascene process. The second hydrogen barrier film 54 and 54' is continuously formed on an interface between the second interlevel insulator 52 and the second contact plug 58 or the wiring 60, and extends on a surface of the second interlevel insulator 52. In this modification, the fourth hydrogen barrier film 70 is formed on the second hydrogen barrier film 54 on the second interlevel insulator 52, and continuously covers an upper surface of the wiring 60.

As described above, according to this embodiment, the hydrogen barrier films 54 and 70 can continuously cover the peripheral surfaces of the second contact plug 58 and wiring 60, including the upper surface of the wiring. Furthermore, above the ferroelectric capacitor 40, the two layers of the hydrogen barrier films 54' and 70 are formed to cover the ferroelectric capacitor 40.

Therefore, this modification can prevent hydrogen, moisture and/or the like from penetrating to the ferroelectric capacitor from outside thereof including the contact plug portion.

THIRD MODIFICATION

A third modification of the present invention provides a semiconductor storage device 430 in which a fourth hydrogen barrier film 70 is additionally formed on the wiring 60 of the third embodiment.

Figure 9:
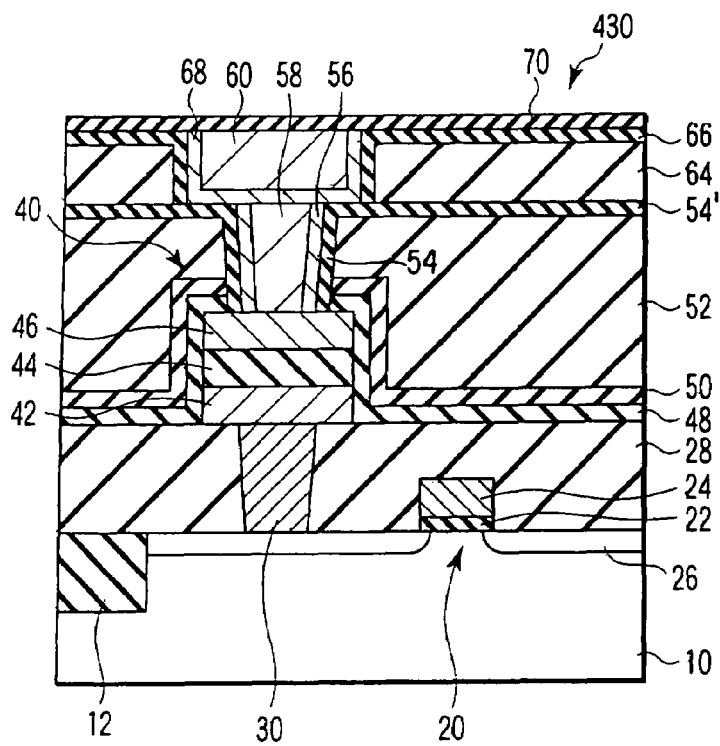
FIG. 9 is a cross-sectional view illustrating an example of a semiconductor device according to a third modification of the present invention.

FIG. 9 shows an example of a cross-sectional configuration of the semiconductor device 430 according to this modification. As in the third embodiment, each of a second contact plug 58 and wiring 60 being connected with an upper electrode 46 of a ferroelectric capacitor 40 is formed by a single damascene process. That is, on the ferroelectric capacitor 40, the second contact plug 58 connected with the upper electrode 46 thereof is formed in a second interlevel insulator 52 through a second hydrogen barrier film 54 and barrier metal 56. Thereafter, the wiring 60 connected with the second contact plug 58 is formed in a third interlevel insulator 64 through a third hydrogen barrier film 66 and second barrier metal 68. The second hydrogen barrier film 54 covering side surfaces of the second contact plug 58 is connected with the third hydrogen barrier film 66. Side surfaces and an upper surface of the wiring 60 are also covered continuously with the third and fourth hydrogen barrier films 66 and 70. It is to be noted that the second hydrogen barrier film 54' is extended on the second interlevel insulator 52, and the third hydrogen barrier film 66 is extended on the third interlevel insulator 64.

As described above, according to this modification, the hydrogen barrier films 54, 66 and 70 can continuously cover the peripheral surfaces of the second contact plug 58 and wiring 60, including the upper surface of the wiring 60, being connected with the upper electrode 46 of the ferroelectric capacitor 40. Furthermore, above the ferroelectric capacitor 40, two layered hydrogen barrier films 66, 70 and single layer of the hydrogen barrier film 54' are formed to doubly cover the ferroelectric capacitor 40.

Therefore, this modification can prevent hydrogen, moisture and/or the like from penetrating to the ferroelectric capacitor from outside thereof including the contact plug portion.

FOURTH MODIFICATION

A fourth modification of the present invention is directed to a semiconductor storage device 440 in which a fourth hydrogen barrier film 70 is further formed on the wiring 60 of the first modification.

Figure 10:
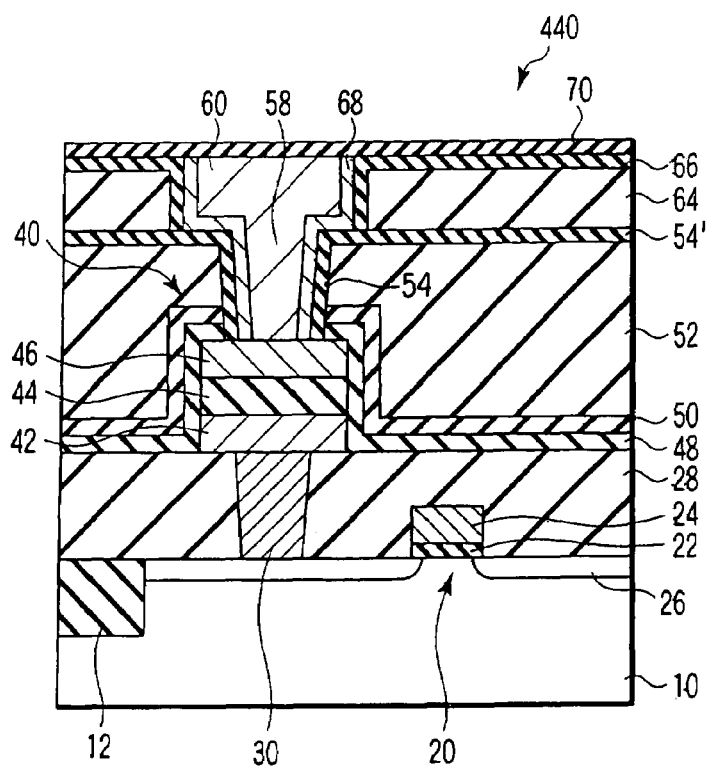
FIG. 10 is a cross-sectional view illustrating an example of a semiconductor device according to a fourth modification of the present invention.

FIG. 10 shows an example of a cross-sectional configuration of the semiconductor device 440 according to this modification. As in the first modification, a second interlevel insulator 52 and third interlevel insulator 64 are formed on a ferroelectric capacitor 40. For example, by a dual damascene process, a second contact plug 58 is formed in the second interlevel insulator 52 through a barrier metal 68 and wiring 60 is formed in the third interlevel insulator 64 through the barrier metal 68 at the same time. A second hydrogen barrier film 54 and 54' is continuously formed on side surfaces of the second contact plug 58 and upper surface of the second interlevel insulator 52. A third hydrogen barrier film 66 is continuously formed on side surfaces of the wiring 60 and surface of the third interlevel insulator 64, and is connected with the second hydrogen barrier film 54 on bottom of a wiring trench. Moreover, the fourth hydrogen barrier film 70 is formed on the third hydrogen barrier film 66 on the third interlevel insulator 64 to continuously cover an upper surface of the wiring 60.

As described above, according to this modification, the hydrogen barrier films 54 and 66 can continuously cover the peripheral surfaces of the second contact plug 58 and wiring 60 being connected with the upper electrode 46 of the ferroelectric capacitor 40. Additionally, above the ferroelectric capacitor 40, two layered hydrogen barrier films 66, 70 and single layer of the hydrogen barrier film 54' are formed to doubly cover the ferroelectric capacitor 40. Additionally, above the ferroelectric capacitor 40, two layered hydrogen barrier films 66, 70 and a single layer of the hydrogen barrier film 54 are formed to doubly cover the ferroelectric capacitor 40.

Therefore, this modification can prevent hydrogen, moisture and/or the like from penetrating to the ferroelectric capacitor from outside thereof including the contact plug portion.

FIFTH MODIFICATION

A fifth modification of the present invention is directed to a semiconductor device 450 which can be formed by a wiring process other than the single damascene process or the dual damascene process.

Figure 11:
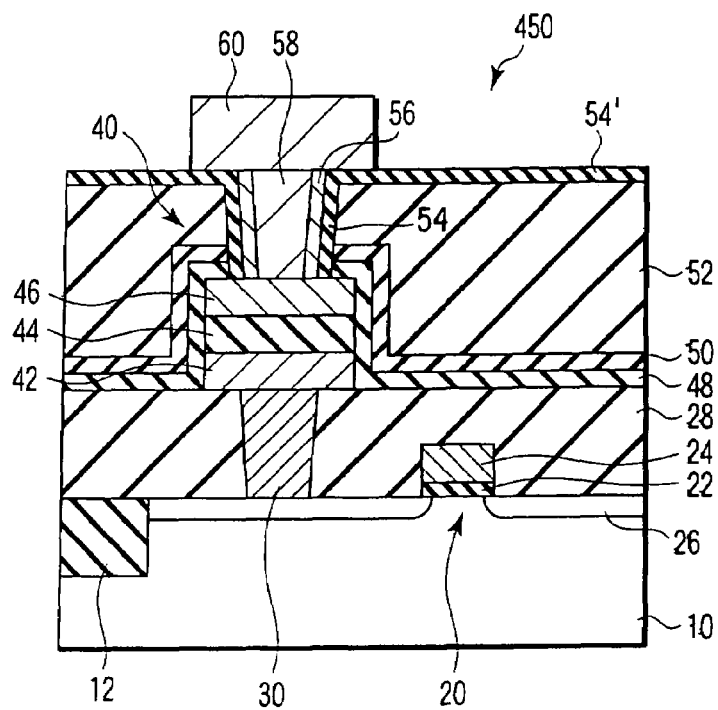
FIG. 11 is a cross-sectional view illustrating an example of a semiconductor device according to a fifth modification of the present invention.

FIG. 11 shows an example of a cross-sectional configuration of the semiconductor device 450 according to this modification. As in the third embodiment, on the ferroelectric capacitor 40, a second contact plug 58 connected with an upper electrode 46 thereof is formed in a second interlevel insulator 52. Side surfaces of the second contact plug 58 are continuously covered with a second hydrogen barrier film 54. It is to be noted that the second hydrogen barrier film 54' is formed to extend on the second interlevel insulator 52. A wiring 60 connected with the second contact plug 58 is formed on the second hydrogen barrier film 54 and 54'.

As described above, according to this modification, the side surfaces of the second contact plug 58 connected with an upper electrode 46 of the ferroelectric capacitor 40 can be continuously covered with the hydrogen barrier film 54. Further, above the ferroelectric capacitor 40, the hydrogen barrier film 54' is formed to cover the ferroelectric capacitor 40.

Therefore, this modification can prevent hydrogen, moisture and/or the like from penetrating to the ferroelectric capacitor from outside thereof including the contact plug portion.

SIXTH MODIFICATION

A sixth modification of the present invention is directed to a semiconductor storage device 460 which can be formed by a wiring process other than the single damascene process or the dual damascene process, as in the fifth modification, and in which a fourth hydrogen barrier film 70 is further formed over a wiring 60.

Figure 12:
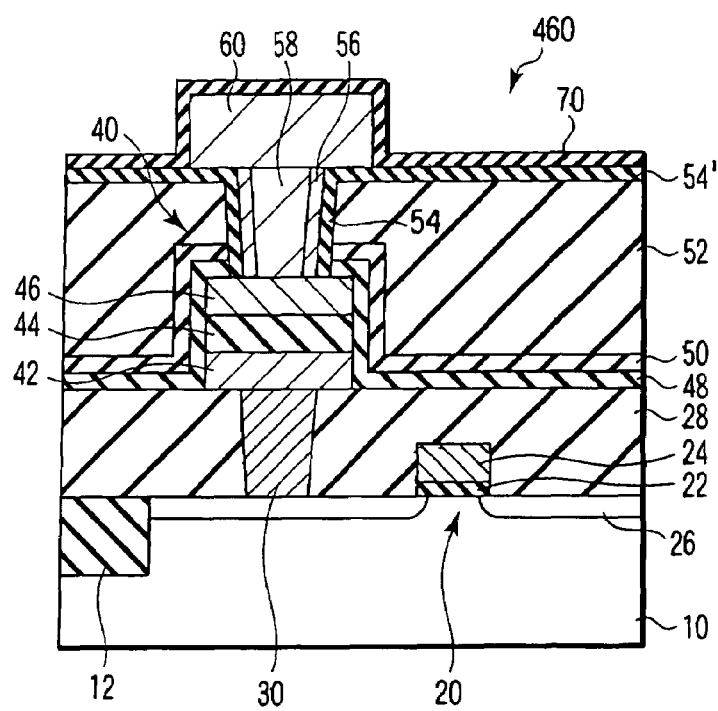
FIG. 12 is a cross-sectional view illustrating an example of a semiconductor device according to a sixth modification of the present invention.

FIG. 12 shows an example of a cross-sectional configuration of the semiconductor device 460 according to this modification. As in the fifth modification, a second contact plug 58 connected with an upper electrode 46 of a ferroelectric capacitor 40 is formed in a second interlevel insulator 52 on the ferroelectric capacitor 40. Side surfaces of the second contact plug 58 are continuously covered with a second hydrogen barrier film 54. It is to be noted that the second hydrogen barrier film 54' is formed to extend on the second interlevel insulator 52. A wiring 60 connected with the second contact plug 58 is formed on the second hydrogen barrier film 54'. Further, an upper surface and side surfaces of the wiring 60 and an entire surface above the second hydrogen barrier film 54' are covered with the fourth hydrogen barrier film 70.

As described above, according to this modification, the peripheral surfaces including the side surfaces of the second contact plug 58 and the upper surface of the wiring 60 being connected with the upper electrode 46 of the ferroelectric capacitor 40 can be covered with the hydrogen barrier films 54, 54', and 70 without gap. Furthermore, above the ferroelectric capacitor 40, two layers of the hydrogen barrier films 54' and 70 are formed to cover the ferroelectric capacitor 40. Therefore, it can be provided the semiconductor device and the manufacturing method thereof which prevent hydrogen, moisture and/or the like from penetrating to the ferroelectric capacitor from outside thereof including the contact plug portion.

SEVENTH MODIFICATION

The present invention can be also applied to a multilevel wiring in addition to the contact plug and wiring being connected with the ferroelectric capacitor 40 described above.

Figure 13:
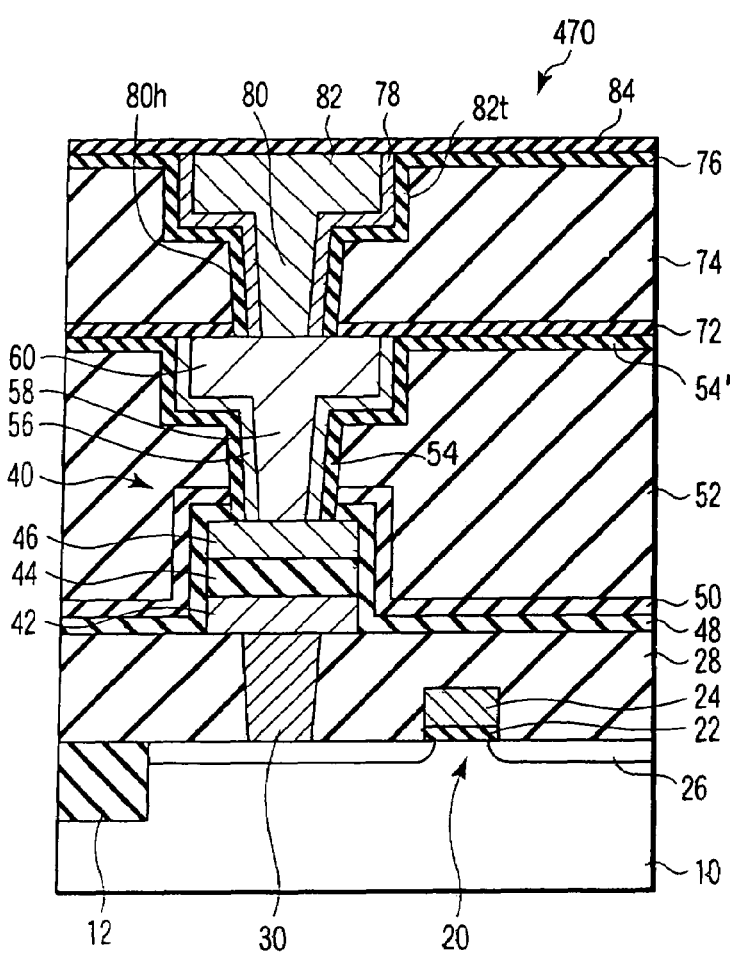
FIG. 13 is a cross-sectional view illustrating an example of a semiconductor device according to a seventh modification of the present invention.

FIG. 13 shows an example of a cross-sectional configuration of a semiconductor device 470 according to this modification. In this modification, as shown in FIG. 13, the present invention is applied to a two-level wiring formed above the ferroelectric capacitor 40 in the first embodiment. A fourth interlevel insulator 74 is formed on a first wiring 60 and second interlevel insulator 52 via a first wiring metal diffusion preventing insulator 72. A third contact hole 80*h* reaching the first wiring 60 and a second wiring groove 82*t* are formed in the fourth interlevel insulator 74. A fifth hydrogen barrier film 76 and a third barrier metal 78 are formed on inner surfaces of the third contact hole 80*h* and second wiring groove 82*t* by, for example, a method similar to that in the first embodiment. The fifth hydrogen barrier film 76 extends on the surface of the fourth interlevel insulator. Subsequently, the third contact hole 80*h* and second wiring groove 82*t* are filled with an electroconductive material, such as Cu, and then a surface of the electroconductive material is planarized by, e.g., CMP with the fifth hydrogen barrier film 76 being used as a stopper, thereby forming a third contact plug 80 and second wiring 82. Moreover, a second wiring metal diffusion preventing insulator 84 is formed on an entire surface including an upper surface of the second wiring 82. By using a material having a hydrogen barrier capability, e.g., SiN film, as the wiring metal diffusion preventing insulators 72 and 84, it can be simultaneously realized to prevent both out-diffusion of a wiring material and in-diffusion of hydrogen and/or the like.

With the configuration shown in FIG. 13, the peripheral surfaces of each contact plug and wiring in the multilevel wiring can be covered with the hydrogen barrier film.

Therefore, this modification can prevent hydrogen, moisture and/or the like from penetrating to the ferroelectric capacitor from outside thereof including the contact plug portion.

EIGHTH MODIFICATION

All the above-described embodiments and modifications have been described based on the semiconductor device including the first insulator 48 disposed between the ferroelectric capacitor 40 and the first hydrogen barrier film 50. However, as described in the first embodiment, the present invention can be embodied without using the first insulator 48.

Figure 14:
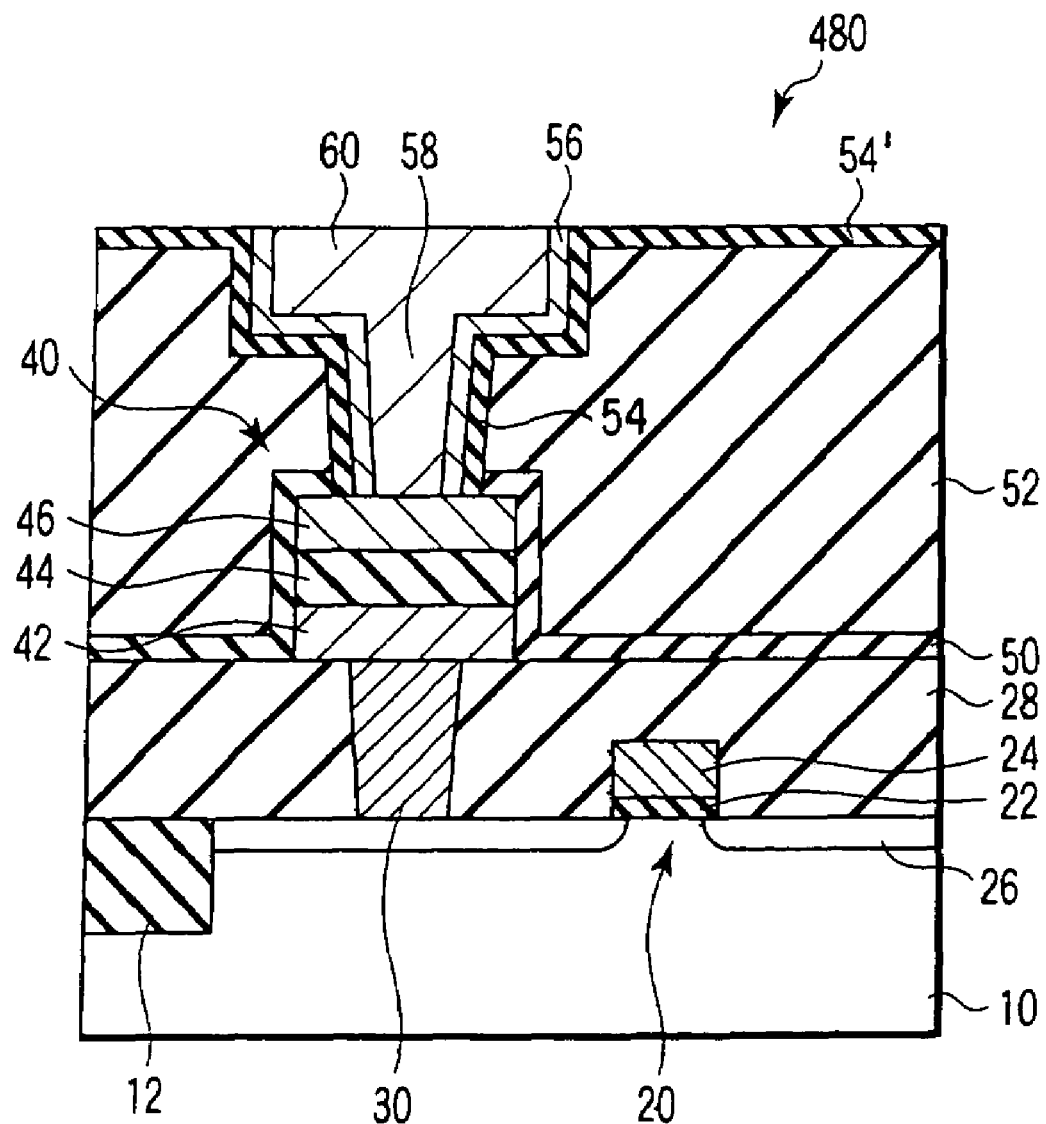
FIG. 14 is a cross-sectional view illustrating an example of a semiconductor device according to an eighth modification of the present invention.

FIG. 14 is a cross-sectional view showing an example of a semiconductor device 480 according to an eighth modification of the present invention which is a semiconductor storage device 480 in which the first insulator 48 is eliminated from the first embodiment. As shown in FIG. 14, a first hydrogen barrier film 50 is formed to be in contact with upper and side surfaces of a ferroelectric capacitor 40 and a surface of a first interlevel insulator 28.

A second interlevel insulator 52 is formed over the ferroelectric capacitor 40 on the first hydrogen barrier film 50, and a second contact plug 58 and wiring 60 being connected with an upper electrode 46 of the ferroelectric capacitor 40 are formed therein. A second hydrogen barrier film 54 and 54' is continuously formed around the second contact plug 58 and wiring 60 and on a surface of the second interlevel insulator 52.

Therefore, according to this modification, hydrogen, moisture and/or the like can be prevented from penetrating to the ferroelectric capacitor from outside thereof including the contact plug portion.

As described above, the manufacturing process of the semiconductor device can be simplified and a manufacturing cost can be reduced without lowering a hydrogen barrier performance, even if the first insulator 48 is omitted. Moreover, this modification is advantageous to a higher integration of the semiconductor device. This modification is not limited to application to the above embodiment, and can be applied to all the embodiments and modifications mentioned above as well as any other modifications and semiconductor devices which are not described herein.

As described above, the present invention is directed to a semiconductor device in which the side surfaces of a contact plug connected with an upper electrode of a ferroelectric capacitor are continuously covered with a hydrogen barrier film and the surface of an interlevel insulator in which the contact plug is formed is covered with the hydrogen barrier film. Consequently, the present invention prevents hydrogen, moisture and/or the like from penetrating to the ferroelectric capacitor from outside thereof including the contact plug portion, thereby improving reliability of the semiconductor device.

The present invention can be applied to not only a ferroelectric random access memory but also a semiconductor device in which a ferroelectric substance is used as a functional element, e.g., an MEMS.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a transistor formed on a semiconductor substrate;
   a ferroelectric capacitor formed above the transistor and comprising a lower electrode, a ferroelectric film and an upper electrode;
   a first insulator formed over the ferroelectric capacitor;
   a first wiring formed above the ferroelectric capacitor;
   a second insulator formed over the first wiring;
   a second wiring formed above the first wiring;
   a contact plug disposed in the second insulator and electrically connecting the first and second wirings;
   a first hydrogen barrier film formed of an insulating film;
   a barrier metal film disposed between the contact plug and the first hydrogen barrier film, the first hydrogen barrier film disposed covering side surfaces of the barrier metal film and the contact plug continuously; and
   a second hydrogen barrier film formed of an insulating film, and extending to a surface of the second insulator, wherein the first hydrogen barrier film continues to the second hydrogen barrier film, the second wiring is formed in the second insulator, and the first hydrogen barrier film is continuously disposed between the second insulator and the contact plug and between the second insulator and the second wiring.

* * * * *